(12) United States Patent
Myung et al.

(10) Patent No.: US 8,261,152 B2
(45) Date of Patent: Sep. 4, 2012

(54) APPARATUS AND METHOD FOR CHANNEL ENCODING/DECODING IN COMMUNICATION SYSTEM USING VARIABLE-LENGTH LDPC CODES

(75) Inventors: Seho Myung, Suwon-si (KR); Hong-Sil Jeong, Seoul (KR); Jae-Yoel Kim, Suwon-si (KR); Sung-Ryul Yun, Suwon-si (KR); Hak-Ju Lee, Incheon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1011 days.

(21) Appl. No.: 12/208,316

(22) Filed: Sep. 10, 2008

(65) Prior Publication Data

US 2009/0070652 A1 Mar. 12, 2009

(30) Foreign Application Priority Data

Sep. 10, 2007 (KR) .................. 10-2007-0091452
Oct. 26, 2007 (KR) .................. 10-2007-0108317

(51) Int. Cl.
G06F 11/00 (2006.01)
(52) U.S. Cl. ...................................................... 714/752
(58) Field of Classification Search .................. 714/752, 714/758
See application file for complete search history.

(56) References Cited

U.S. PATENT DOCUMENTS

| | | | | |
|---|---|---|---|---|
| 7,089,479 B2 * | 8/2006 | Matsumoto | .................. | 714/758 |
| 2005/0078765 A1 * | 4/2005 | Jeong et al. | .................. | 375/267 |
| 2005/0251730 A1 * | 11/2005 | Classon et al. | ................ | 714/801 |
| 2006/0036925 A1 * | 2/2006 | Kyung et al. | .................. | 714/758 |
| 2007/0101246 A1 * | 5/2007 | Kyung et al. | ................. | 714/804 |
| 2010/0325511 A1 * | 12/2010 | Oh et al. | ....................... | 714/752 |

OTHER PUBLICATIONS

Digital Video Broadcasting (DVB); Second generation framing structure, channel coding and modulation systems for Broadcasting, Interactive Services, News Gathering and other broadband satellite applications (DVB-S2), ETSI EN 302 307 V1.2.1, (Aug. 2009).

* cited by examiner

Primary Examiner — Scott Baderman
Assistant Examiner — Yair Leibovich
(74) Attorney, Agent, or Firm — Jefferson IP Law, LLP

(57) ABSTRACT

A method and apparatus for generating Low-Density Parity Check (LDPC) codes of various block lengths from a structured LDPC code in a communication system is provided. To support various block lengths, predefined rules are applied to a parity check matrix of an LDPC code, and then shortening is selectively applied to the parity check matrix. Subsequently, if information data bits are input, the input data information bits are encoded into an LDPC codeword by using the parity check matrix according to a preset encoding scheme, and then the encoded LDPC codeword is transmitted after puncturing is selectively applied.

18 Claims, 6 Drawing Sheets

$$H_1 = \begin{bmatrix} 1 & 1 & 1 & 1 & 1 & 1 & 0 & 0 \\ 1 & 1 & 0 & 1 & 0 & 1 & 1 & 0 \\ 1 & 1 & 1 & 0 & 0 & 0 & 1 & 1 \\ 1 & 0 & 1 & 1 & 1 & 0 & 0 & 1 \end{bmatrix}$$

FIG.1
(CONVENTIONAL ART)

APPARATUS AND METHOD FOR CHANNEL ENCODING/DECODING IN COMMUNICATION SYSTEM USING VARIABLE-LENGTH LDPC CODES

PRIORITY

This application claims the benefit under 35 U.S.C. §119 (a) of Korean patent applications filed in the Korean Industrial Property Office on Sep. 10, 2007 and Oct. 26, 2007, and assigned Serial Nos. 2007-0091452 and 2007-00108317 respectively, the entire disclosures of each of which are hereby incorporated by reference.

BACKGROUND OF THE INVENTION

1. Field of the Invention

The present invention relates to a communication system employing Low-Density Parity Check (LDPC) codes as error-correcting codes. More particularly, the present invention relates to a channel encoding/decoding apparatus and method using LDPC codes, the block lengths of which are variable.

2. Description of the Related Art

In wireless communication systems, link performance is degraded by various kinds of noise and fading phenomena, Inter-Symbol Interference (ISI), etc. Therefore, in order to implement high-speed digital communication systems requiring high data throughput and reliability, such as next-generation communication systems, digital broadcasting systems, and portable Internet services, it is essential to develop technology for overcoming noise, fading, and ISI. Research has been conducted to provide error-correcting codes to efficiently restore information distortion and improving communication reliability.

LDPC codes were first reported by Gallager in the 1960's but were not further investigated because, in view of the state of the art at that time, they were too complex to be implemented. However, as turbo codes, which were discovered by Berrou, Glavieux, and Thitimajshima in 1993, provide performance approaching the Shannon's channel capacity limit, there have been many interpretations of their performance and characteristics, and research on channel encoding based on iterative decoding and graphs has been then pursued. Upon this opportunity, the LDPC codes have been restudied in the late 1990's, and finally have been proven to have performance close to the Shannon's channel capacity limit when decoding is performed by applying iterative decoding based on sum-product algorithms on Tanner graphs. A Tanner graph is a special type of factor graph.

The LDPC codes are typically represented using graph representations, and many characteristics of the LDPC codes can be analyzed through methods based on graph theories, algebra, and probability theories. In general, graph representations of channel codes are not only useful for code descriptions, but can also derive natural decoding algorithms because each of intra-graph vortexes corresponding to information on encoded bits and each of intra-graph edges corresponding to relations between the encoded bits may be regarded as a communication network where the respective bits exchange messages through the respective edges. Examples of decoding algorithms derived from trellis that may be considered a type of graph include the conventional Viterbi algorithm and the Bahl, Cocke, Jelinek and Raviv (BCJR) algorithm.

An LDPC code is generally defined by a parity check matrix, and may be represented using a bipartite graph called a Tanner graph. The bipartite graph refers to a graph in which vortexes constituting the graph are divided into two different types of vortexes, and the LDPC code is represented by a bipartite graph including one set of vortexes called variable nodes and the other set of vortexes called check nodes. The variable nodes correspond one-to-one to encoded bits.

Hereinafter, a graph representation of a conventional LDPC code will be described with reference to FIGS. 1 and 2.

FIG. 1 illustrates an exemplary parity check matrix H1 of a conventional LDPC code, including four rows and eight columns. Referring to FIG. 1, the fact that the parity check matrix includes eight columns means that the LDPC code is an LDPC code for generating a codeword of length 8, and the respective columns correspond to encoded eight bits.

FIG. 2 illustrates a Tanner graph corresponding to H1 of a conventional LDPC code.

Referring to FIG. 2, the Tanner graph of the conventional LDPC code includes eight variable nodes $x_1$ 202, $x_2$ 204, $x_3$ 206, $x_4$ 208, $x_5$ 210, $x_6$ 212, $x_7$ 214, and $x_8$ 216, and four check nodes 218, 220, 222, 224. Here, an ith column and a jth row of the parity check matrix H1 of the LDPC code correspond to a variable node $x_i$ and a jth check node respectively. In addition, a value of 1 at an intersection of the ith column and the jth row of the parity check matrix H1 of the LDPC code, that is, a non-zero value, means that there is an edge between the variable node $x_i$ and the jth check node on the Tanner graph, as illustrated in FIG. 2.

In the tanner graph of the LDPC code, the degree of each of the variable and check nodes refers to the number of edges connected to each node, and is equal to the number of non-zero entries in a column or row of the parity check matrix of the LDPC code, corresponding to the relevant node. In FIG. 2, for example, the degrees of the variable nodes $x_1$ 202, $x_2$ 204, $x_3$ 206, $x_4$ 208, $x_5$ 210, $x_6$ 212, $x_7$ 214, and $x_8$ 216 are 4, 3, 3, 3, 2, 2, 2, and 2, respectively, and the degrees of the check nodes 218, 220, 222, and 224 are 6, 5, 5, and 5, respectively. In addition, the numbers of non-zero entries in the respective columns of the parity check matrix H1 of FIG. 1, corresponding to the variable nodes of FIG. 2, coincide with the above degrees of 4, 3, 3, 3, 2, 2, 2, and 2, in order, and the numbers of non-zero entries in the respective rows of the parity check matrix H1 of FIG. 1, corresponding to the check nodes of FIG. 2, coincide with the above degrees of 6, 5, 5, and 5, in order.

In order to represent a degree distribution for nodes of an LDPC code, $f_i$ denotes the ratio of the number of variable node of degree i to the total number of variable nodes, and $g_j$ denotes the ratio of the number of check node of degree j to the total number of check nodes. For example, in the case of the LDPC code according to FIGS. 1 and 2, $f_2$=4/8, $f_3$=3/8, $f_4$=1/8, and $f_i$=0 for i≠2, 3, 4, and $g_5$=3/4, $g_6$=1/4, and $g_j$=0 for j≠5, 6. If the length of the LDPC code, that is, the number of columns, is N, and the number of rows is N/2, the density of non-zero entries in the overall parity check matrix having the above degree distribution is calculated by the following equation:

$$\frac{2f_2 N + 3f_3 N + 4f_4 N}{N \cdot N/2} = \frac{5.25}{N} \quad (1)$$

In Equation (1), the density of non-zero entries having a value of 1 continues to decrease as N increases. In general, since the density of non-zero entries is inversely proportional to the code length N of an LDPC code, the density of nonzero-entries is very low when N is large. The term "low-density" in the term LDPC originated as a result of the above relationship.

Reference will now be made to the characteristics of a parity check matrix of a conventional LDPC code, with reference to FIG. 3. FIG. 3 illustrates a conventional LDPC code adopted as standard technology in the Digital Video Broadcasting-Satellite Second Generation (DVB-S2). DVB-S2 is a European digital broadcasting standard.

Referring to FIG. 3, N, denotes an LDPC codeword length, $K_1$ denotes an information word length, and $(N_1-K_1)$ denotes a parity length. Integers $M_1$ and q are determined in such a manner as to satisfy $(N_1-K_1)/M_1=q$. With regard to this, $K_1/M_1$ must also be an integer. For the convenience of explanation, the parity check matrix of FIG. 3 will be referred to as a first parity check matrix $H_1$.

Referring to FIG. 3, the structure of the parity part in the parity check matrix, that is, columns $K_1$ to $(N_1-1)$, is in the form of a dual diagonal structure. Thus, the degree distribution of all columns included in the parity part has a value of 2, except for the last column having a value of 1.

The structure of the information word part in the parity check matrix, that is, columns 0 to $(K_1-1)$, is established according to the following rules:

<Rule 1>: $K_1$ columns corresponding to an information word are grouped into column groups each including $M_1$ columns to generate $K_1/M_1$ column groups. A way to construct each column belonging to each column group follows Rule 2 as described below.

<Rule 2>: First, a position of 1 in the 0th column of each ith column group (i=0, 1, ..., $K_1/M_1-1$) is determined. Here, $D_i$ denotes the degree of the 0th column of each ith column group. Assuming that row positions including an entry of 1 in the 0th column of each ith column group are $R_{i,0}^{(1)}$, $R_{i,0}^{(2)}, \ldots, R_{i,0}^{(D_i)}$, row positions including an entry of 1 in a jth column of an ith column group, $R_{i,j}^{(k)}$ (k=1, 2, ..., $D_i$), are defined by the following equation:

$$R_{i,j}^{(k)} = R_{i,(j-1)}^{(k)} + q \mod (N_1-K_1),$$

$$k=1,2,\ldots,D_i, i=0,1\ldots,K_1/M_1-1, j=1,2,\ldots,M_1-1 \quad (2)$$

According to Rule 2, all columns belonging to an ith column group (i=0, 1, ..., $K_1/M_1-1$) have a constant degree of $D_i$.

LDPC codes designed based on the above rules can be efficiently encoded using a structured form. However, the DVB-S2 standard employing such LDPC codes has disadvantages in that only two block lengths of LDPC codes are used due to limitations on using the LDPC codes, as well as in that different parity check matrices for supporting the two block lengths must be stored.

Next, a description will be given of individual steps of an LDPC encoding procedure using the aforementioned DVB-S2 parity check matrix.

In the following description, for the convenience of explanation, information word bits of length $K_1$ will be designated by $(i_0, i_1, \ldots, i_{K_1-1})$, and parity bits of length $N_1-K_1$ will be designated by $(p_0, p_1, \ldots, p_{N_1-K_1-1})$. An LDPC code to be described in detail below is characterized by $N_1=16200$, $K_1=10800$, $M_1=360$, and q=15.

Step 1: Parity bits are initialized: $p_0=p_1=\ldots=p_{N_1-K_1-1}=0$.

Step 2: Information on row positions including an entry of 1 in the first column of the first column group is fetched from stored parity check matrix information:

$R_{1,0}^{(1)}=0, R_{1,0}^{(2)}=2084, R_{1,0}^{(3)}=1613, R_{1,0}^{(4)}=1548, R_{1,0}^{(5)}=1286,$ $R_{1,0}^{(6)}=1460, R_{1,0}^{(7)}=3196, R_{1,0}^{(8)}=4297, R_{1,0}^{(9)}=2481, R_{1,0}^{(10)}=3369,$ $R_{1,0}^{(11)}=3451, R_{1,0}^{(12)}=4620, R_{1,0}^{(13)}=2622.$

Using the fetched information and the information bit $i_0$, specific parity bits $p_x$ are updated as given in the following equation. Here, x denotes the value of each $R_{1,0}^{(k)}$, k=1, 2, ..., 13:

$p_0=p_0 \oplus i_0, p_{2084}=p_{2084} \oplus i_0, p_{1613}=p_{613} \oplus i_0,$ $p_{1548}=p_{1548} \oplus i_0, p_{1286}=p_{1286} \oplus i_0, p_{1460}=p_{1460} \oplus i_0,$ $p_{3196}=p_{3196} \oplus i_0, p_{4297}=p_{4297} \oplus i_0,$
$p_{2481}=p_{2481}=p_{2481} \oplus i_0,$ $p_{3369}=p_{3369} \oplus i_0, p_{3451}=p_{3451} \oplus i_0, p_{4620}=p_{4620} \oplus i_0,$ $p_{2622}=p_{2622} \oplus i_0. \quad (3)$ In Equation (3), $p_x=p_x \oplus i_0$ may be expressed by $p_x \leftarrow p_x \oplus i_0$, and $\oplus$ denotes binary addition.

Step 3: For the next 359 information word bits $i_1, i_2, \ldots, i_{359}$ following $i_0$, values defined by the following equation are first obtained:

$$\{x+(m \mod M_1) \times q\} \mod(N_1-K_1), M_1=360, m=1,2,\ldots,359 \quad (4)$$

In Equation (4), x denotes the value of each $R_{1,0}^{(k)}$, k=1, 2, ..., 13. It is to be noted that Equation (4) is conceptually the same expression as Equation (2).

Next, a similar operation to Equation (3) is performed using the values obtained by Equation (4). That is, for $i_m$, parity bits $p_{\{x+(m \mod M_1) \times q\} \mod(N_1-K_1)}$ are updated. For m=1 (i.e. $i_1$), for example, parity bits $p_{\{x+(m \mod M_1) \times q\} \mod(N_1-K_1)}$ are updated as given in the following equation:

$p_{15}=p_{15} \oplus i_0, p_{2099}=p_{2099} \oplus i_0, p_{1628}=p_{1628} \oplus i_0,$ $p_{1563}=p_{1563} \oplus i_0, p_{1301}=p_{1301} \oplus i_0, p_{1475}=p_{1475} \oplus i_0,$ $p_{3211}=p_{3211} \oplus i_0, p_{4312}=p_{4312} \oplus i_0, p_{2496}=p_{2496} \oplus i_0,$ $p_{3384}=p_{3384} \oplus i_0, p_{3466}=p_{3466} \oplus i_0, p_{4635}=p_{4635} \oplus i_0,$ $p_{2637}=p_{2637} \oplus i_0. \quad (5)$ It is to be noted that q=15 in the case of Equation (5). Such an operation is also performed for m=1, 2, ..., 359 in the same manner.

Step 4: In the same manner as in step 2, for the 361th information word bit $i_{360}$, information on $R_{2,0}^{(k)}$ (k=1, 2, ..., 13) is fetched, and specific parity bits $p_x$ are updated. Here, x denotes $R_{2,0}^{(k)}$. For the next 359 information word bits $i_{361}$, $i_{362}, \ldots, i_{719}$ following $i_{360}$, parity bits $p_{\{x+(m \mod M_1) \times q\} \mod(N_1-K_1)}$ (m=361, 362, ..., 719) are updated by applying Equation (4).

Step 5: For all 360 information word bit groups, steps 2, 3 and 4 are repeated respectively. Finally, parity bits are determined by the following equation:

$$p_i=p_i \oplus_{i-1}, i=1,2,\ldots,N_1-K_1-1 \quad (6)$$

In Equation (6), parity bits $p_i$ are parity bits for which LDPC encoding is completed.

As mentioned above, encoding in the DVB-S2 is conducted through steps 1 to 5.

In order to apply LDPC codes as described above to a real world communication system, they must be designed in such a manner to be appropriate for a data transfer rate required by the communication system. More particularly, in adaptive communication systems employing Hybrid Automatic Retransmission reQuest (HARQ) schemes and Adaptive Modulation and Coding (AMC) schemes, as well as communication systems supporting various broadcast services, LDPC codes having various block lengths are needed to support various data transfer rates demanded by users.

However, in the case of the aforementioned LDPC code used in the DVB-S2 system, not only there are only two block lengths due to limited use of the LDPC code, but also independent parity check matrices are needed for the two respective block lengths.

When available block lengths are limited as mentioned above, there is a problem in that it is difficult to enhance the extensibility and flexibility of a system.

In addition, storing all the parity check matrices corresponding to the respective block lengths of the LDPC code causes a problem of memory efficiency degradation.

SUMMARY OF THE INVENTION

An aspect of the present invention is to address at least the above-mentioned problems and/or disadvantages and to provide at least the advantages described below. Accordingly, an aspect of the present invention is to provide a channel encoding/decoding apparatus in a communication system using LDPC codes of various block lengths and a control method thereof.

A further aspect of the present invention is to provide an apparatus and method for generating LDPC codes of various block lengths by using a given LDPC code without designing new parity check matrices to enhance memory efficiency.

In accordance with an aspect of the present invention, a method of encoding a structured variable-length LDPC code is provided. The method includes detecting information on a pre-stored first parity check matrix, identifying a block length of a LDPC code, determining a grouping size for an information word of a second parity check matrix, configuring submatrices corresponding to the information word of the second parity check matrix from the first parity check matrix in correspondence with the grouping size, configuring submatrices corresponding to a parity of the second parity check matrix, and performing encoding based on one of the first parity check matrix and the second parity check matrix.

In accordance with another aspect of the present invention, an apparatus for encoding a variable-length LDPC code is provided. The apparatus includes an encoder for identifying a block length of an LDPC code to determine a grouping size for an information word of a second parity check matrix, for configuring submatrices corresponding to the information word of the second parity check matrix from a pre-stored first parity check matrix in correspondence with the grouping size; for configuring submatrices corresponding to a parity of the second parity check matrix, and for performing encoding based on one of the first parity check matrix and the second parity check matrix, a modulator for modulating the LDPC code into modulation symbols using a preset modulation scheme, and a transmitter for transmitting the modulation symbols.

In accordance with yet another aspect of the present invention, a method of decoding a structured variable-length LDPC code is provided. The method includes receiving a signal, detecting information on a pre-stored first parity check matrix, identifying a block length of an LDPC code to be decoded, determining a grouping size for an information word of a second parity check matrix, configuring submatrices corresponding to the information word of the second parity check matrix from the first parity check matrix in correspondence with the grouping size, configuring submatrices corresponding to a parity of the second parity check matrix, and decoding the received signal into the LDPC code, based on one of the first parity check matrix and the second parity check matrix.

In accordance with still another aspect of the present invention, an apparatus for decoding a variable-length LDPC code is provided. The apparatus includes a receiver for receiving a signal, a demodulator for demodulating the received signal using a preset demodulation scheme to output a demodulated signal, and a decoder for identifying a length of an LDPC code, into which the demodulated signal output from the modulator is decoded, for determining a grouping size for an information word of a second parity check matrix, for configuring submatrices corresponding to the information word of the second parity check matrix from a pre-stored first parity check matrix in correspondence with the grouping size and configuring submatrices corresponding to a parity of the second parity check matrix, and for decoding the received signal into the LDPC code, based on one of the first parity check matrix and the second parity check matrix.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments of the present invention will be more apparent from the following description taken in conjunction with the accompanying drawings, in which:

FIG. 1 is a view illustrating an exemplary parity check matrix of a conventional LDPC code of length 8;

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the present invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions are omitted for clarity and conciseness. Further, it should be noted that only parts essential for understanding the operations according to the present invention will be described and a description of parts other than the essential parts will be omitted in order not to obscure the gist of the present invention.

Exemplary embodiments of the present invention propose an apparatus and method for using a parity check matrix of a specific form of an LDPC code to generate LDPC codes of various block lengths that are larger or smaller than that of the specific LDPC code, and for performing channel encoding/decoding by using the LDPC codes of various block lengths.

Figure 2:
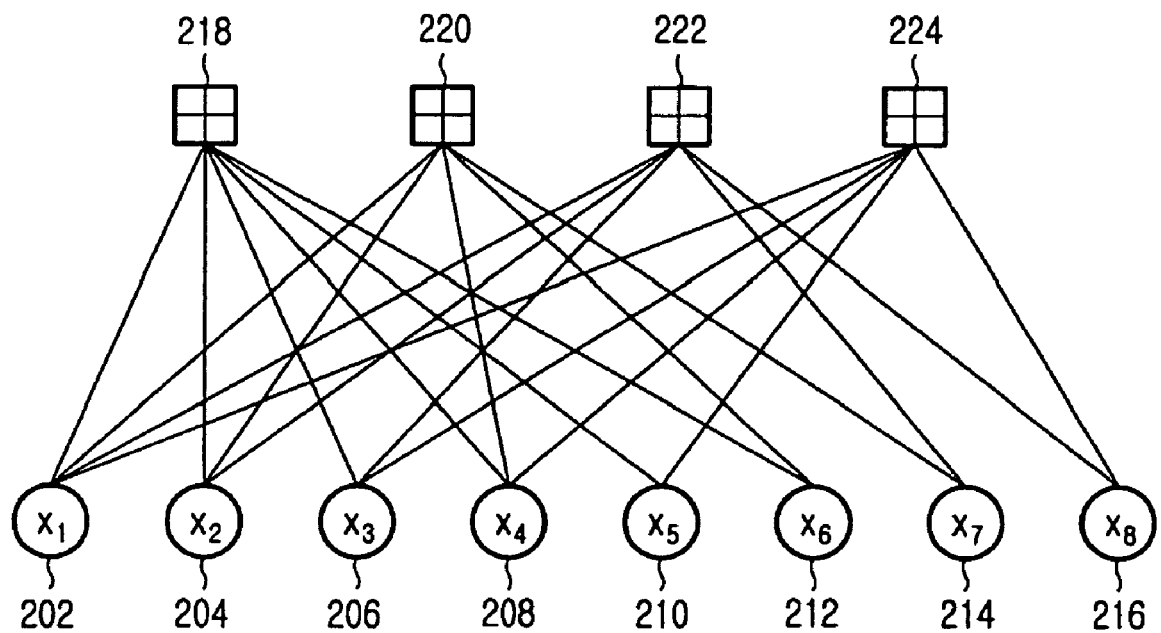
FIG. 2 is a view illustrating a Tanner graph representation of an exemplary parity check matrix of a conventional LDPC code of length 8.
Figure 3:
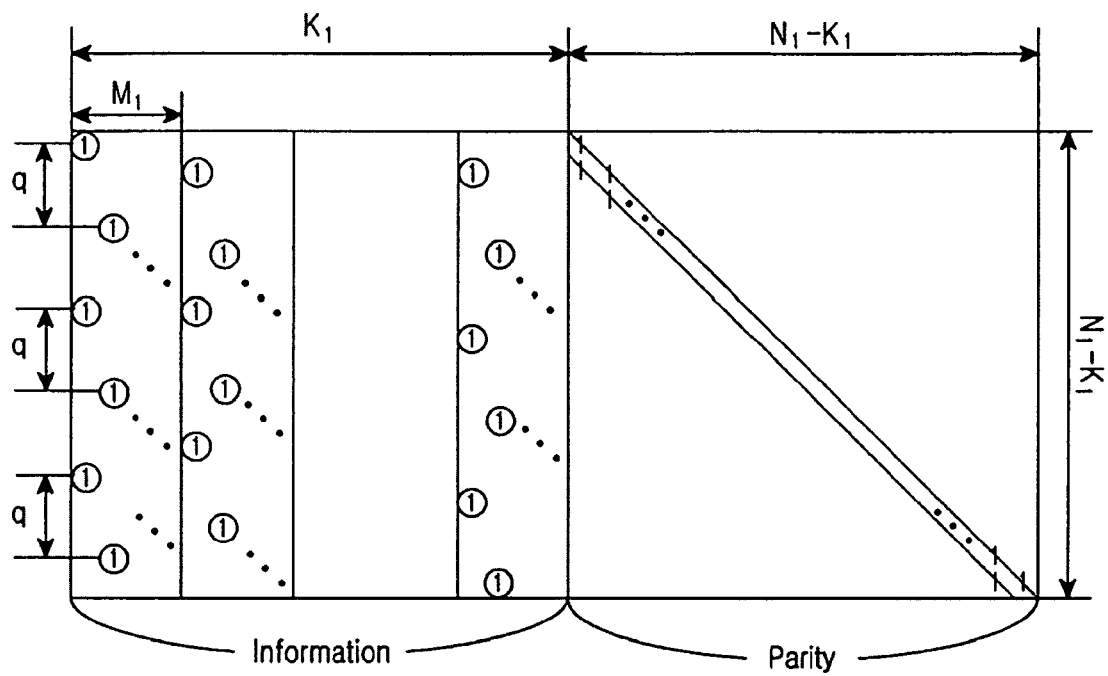
FIG. 3 is a view illustrating a structure of a conventional DVB-S2 LDPC code.
Figure 4:
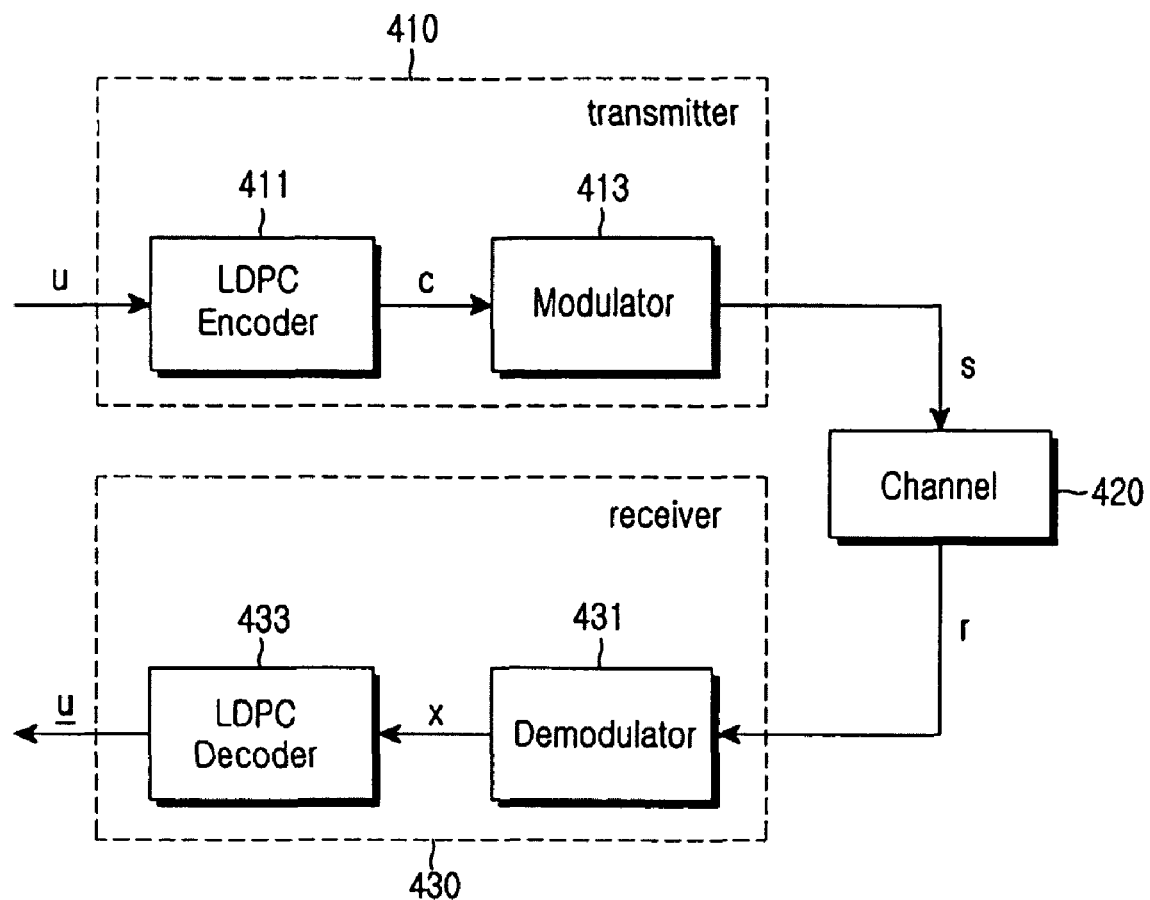
FIG. 4 is a block diagram illustrating a structure of a digital communication system using an LDPC code in accordance with an exemplary embodiment of the present invention.

FIG. 4 illustrates a structure of a digital communication system using an LDPC code in accordance with an exemplary embodiment of the present invention.

Referring to FIG. 4, before transmission of a message u, the message u is encoded by an LDPC encoder 411 into signal c which is then modulated into signal by a modulator 413 in a transmitter 410, and then is transmitted over a radio channel 420. Then, a demodulator 431 in a receiver 430 receives a signal r transmitted over the radio channel to demodulate the received signal r to output a demodulated signal x, and an LDPC decoder 433 in the receiver 430 estimates an estimate u of the message from the demodulated signal x.

The LDPC encoder 411 and the LDPC decoder 433 generate a parity check matrix corresponding to a block length required by the communication system according to a preset scheme. More particularly, in an exemplary embodiment of the present invention, the LDPC encoder 411 and the LDPC decoder 433 can support various block lengths by using one LDPC code without needing to store separate additional information. Although the generation of a parity check matrix corresponding to a block length required by the communication system may be achieved by the LDPC encoder 411 and the LDPC decoder 433, as described above, the parity check matrix may also be generated by a separate parity check matrix generation unit (not shown).

Operations of the LDPC encoder 411 and the LDPC decoder 433 for supporting various block lengths will be described in detail below along with a description of the following encoding method.

Reference will now be made to a method of encoding a structured variable-length LDPC code according to an exemplary embodiment of the present invention.

The encoding method of an exemplary embodiment of the present invention includes detecting information on a pre-stored first parity check matrix to generate a second parity check matrix corresponding to a required block length of an LDPC code, and performing encoding based on either the first parity check matrix or the newly generated second parity check matrix.

Initially, a procedure of generating a parity check matrix corresponding to a variable block length from a pre-stored parity check matrix will be discussed.

According to conventional design rules of a parity check matrix, all characteristics of an LDPC code structure are determined by a process of grouping columns into column groups in units of $M_1$ columns, the degree of the first column in each column group, and row positions including an entry of 1 in the first column of each column group. Thus, in order to support an LDPC code of a different block length from the LDPC code having characteristics as described above, it is sufficient to newly group columns of a given parity check matrix into column groups, and determine row positions including an entry of 1 in the first column of each of the newly obtained column groups.

An exemplary embodiment of the present invention proposes a method of supporting an LDPC code of a different block length from an LDPC code of a specific block length.

Figure 5:
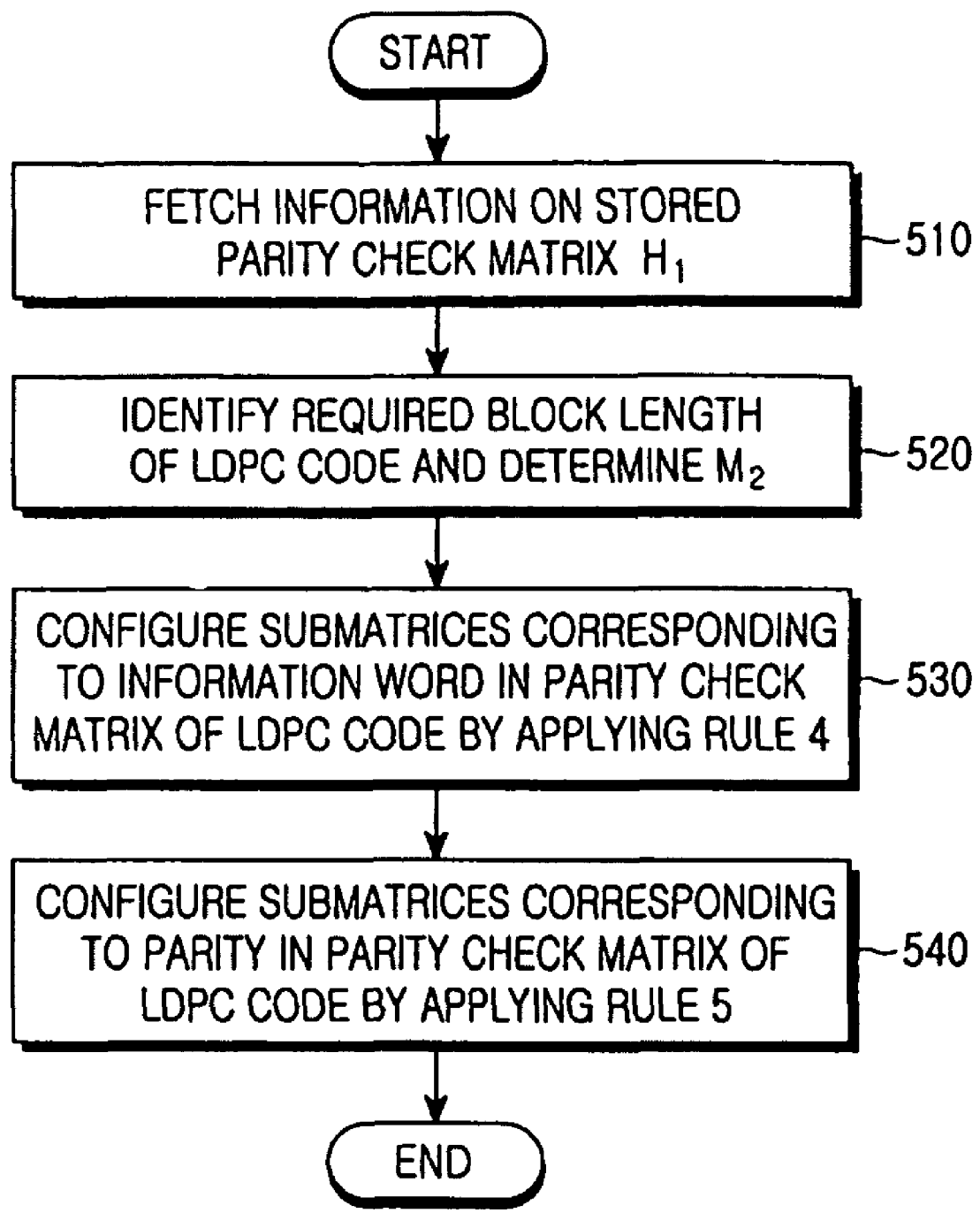
FIG. 5 is a flowchart illustrating a procedure of generating an LDPC code of a different block length from a pre-stored parity check matrix of an LDPC code in accordance with an exemplary embodiment of the present invention.

FIG. 5 illustrates a procedure of generating an LDPC code of a different block length from a pre-stored parity check matrix of an LDPC code according to an exemplary embodiment of the present invention.

For the convenience of explanation, $N_2$ denotes a codeword length of a second LDPC code to be supported from a pre-stored parity check matrix (i.e. first parity check matrix $H_1$) of a first LDPC code, $K_2$ denotes an information word length of the second LDPC code, and $(N_2-K_2)$ denotes a parity length of the second LDPC code. Here, $K_2$ is a divisor of $K_1$, $N_2$ is a divisor of $N_1$, and $K_1$, $K_2$, $N_1$, and $N_2$ satisfy $N_1/N_2=K_1/K_2=r$. A parity check matrix of the newly designed second LDPC code will be referred to as a second parity check matrix $H_2$.

Referring to FIG. 5, in step 510, the LDPC encoder detects the pre-stored first parity check matrix $H_1$. In step 520, the LDPC encoder identifies a required block length of the second LDPC code, and determines $M_2$ corresponding to the identified block length, as described in the following Rule 3.

<Rule 3>: $M_2$ is defined as $M_2=M_1/r$. $K_2$ columns corresponding to an information word of the second parity check matrix are grouped into column groups each including $M_2$ columns to generate $K_2/M_2$ column groups. The value of $K_2/M_2$ is equal to the number of column groups for the first parity check matrix described above in Rules 1 and 2, that is, $K_1/M_1$, and it can be noted from the following equation that q also has the same value:

$$q = \frac{N_1 - K_1}{M_1} = \frac{rN_2 - rK_2}{rM_2} = \frac{N_2 - K_2}{M_2} \qquad (7)$$

Subsequently, in step 530, the LDPC encoder configures submatrices corresponding to the information word in the parity check matrix of the second LDPC code by applying the following Rule 4.

<Rule 4>: Using row positions including an entry of 1 in H1, given in Equation (2), $M_2$, and q, row positions including an entry of 1 in a jth column (j=0, 1, 2, . . . , $M_2-1$) of an ith column group of the second parity check matrix H2 to be newly generated, $S_{i,k}^{(k)}$ (k=1, 2, . . . , $D_i$), are defined by the following equation:

for $i=0,1, \ldots, K_2/M_2-1$ and $j=0,1,2, \ldots, M_2-1$, $S_{i,0}^{(k)}=R_{i,0}^{(k)} \bmod(N_2-K_2), k=1,2,\ldots,D_i$, $S_{i,j}^{(k)}=S_{i,(j-1)}^{(k)}+q \bmod(N_2-K_2).$ \hfill (8)

In step 540, the LDPC encoder configures submatrices corresponding to a parity in the parity check matrix of the second LDPC code by applying the following Rule 5.

<Rule 5>: A part corresponding to the parity in the parity check matrix, that is, columns $K_2$ to $(N_2-1)$, is established in such a manner as to be in the form of a dual diagonal structure. Thus, the degree distribution of all columns included in the parity part has a value of 2, except for the last column having a value of 1.

Since the second parity check matrix $H_2$ generated using the above Rules 3, 4, and 5 is designed using untouched information on the first parity check matrix $H_1$ that has been generated using the conventional Rules 1 and 2, a separate memory for storing $H_2$ is not needed. That is, if only information on $H_1$ is available, an LDPC codeword can be generated by generating $H_2$ and then applying it to the LDPC encoder.

Next, reference will now be made to a procedure of encoding the new second LDPC code, which is implemented by a method proposed in an exemplary embodiment of the present invention.

In the following description, a case where a block length of a new LDPC code to be generated is $N_2=4050$ and an information word length is $K_2=2700$ will be given by way of example. Thus, since $N_1/N_2=K_1/K_2=4$ is established, $M_2$ is $M_2=M_1/4=90$ according to its definition, and q is fixed to q=15.

Step 1: Parity bits are initialized: $p_0=p_1=\ldots=p_{N_2-K_2-1}=0$.

Step 2: Information on row positions including an entry of 1 in the first column of the first column group is fetched from stored parity check matrix ($H_1$) information:

$$R_{1,0}^{(1)}=0, R_{1,0}^{(2)}=2084, R_{1,0}^{(3)}=1613, R_{1,0}^{(4)}=1548, R_{1,0}^{(5)}=1286,$$

$$R_{1,0}^{(6)}=1460, R_{1,0}^{(7)}=3196, R_{1,0}^{(8)}=4297, R_{1,0}^{(9)}=2481, R_{1,0}^{(10)}=3369,$$

$$R_{1,0}^{(11)}=3451, R_{1,0}^{(12)}=4620, R_{1,0}^{(13)}=2622.$$

Step 3: By applying the above Rule 4, values of $S_{1,0}^{(k)}$ are obtained from $R_{1,0}^{(k)}$, k=1, 2, ..., 13, as given below.

$$S_{1,0}^{(k)}=R_{1,0}^{(k)} \mod(N_2-K_2), k=1,2,\ldots,13,$$

$$S_{1,0}^{(1)}=0, S_{1,0}^{(2)}=734, S_{1,0}^{(3)}=263, S_{1,0}^{(4)}=198, S_{1,0}^{(5)}=1286,$$

$$S_{1,0}^{(6)}=110, S_{1,0}^{(7)}=496, S_{1,0}^{(8)}=247, S_{1,0}^{(9)}=1131, S_{1,0}^{(10)}=669,$$

$$S_{1,0}^{(11)}=751, S_{1,0}^{(12)}=570, S_{1,0}^{(13)}=1272.$$

Using the above information and $i_0$, specific parity bits $p_x$ are updated as given in the following equation (Here, x denotes the value of each $S_{1,0}^{(k)}$, k=1, 2, ..., 13):

$$p_0=p_0 \oplus i_0, p_{734}=p_{734} \oplus i_0, p_{263}=p_{263} \oplus i_0,$$

$$p_{198}=p_{198} \oplus i_0, p_{1286}=p_{1286} \oplus i_0, p_{110}=p_{110} \oplus i_0,$$

$$p_{496}=p_{496} \oplus i_0, p_{247}=p_{247} \oplus i_0, p_{1131}=p_{1131} \oplus i_0,$$

$$p_{669}=p_{669} \oplus i_0, p_{751}=p_{751} \oplus i_0, p_{570}=p_{570} \oplus i_0,$$

$$p_{1272}=p_{1272} \oplus i_0, \tag{9}$$

In Equation (9), $\oplus$ (denotes binary addition.

Step 4: For next 89 information word bits $i_1, i_2, \ldots, i_{89}$ following $i_0$, values defined by the following equation are first obtained:

$$\{x+(m \mod M_2) \times q\} \mod(N_2-K_2), M_1=90, m=1,2,\ldots,89 \tag{10}$$

In Equation (10), x denotes the value of each $S_{1,0}^{(k)}$, k=1, 2, ..., 13. It is to be noted that Equation (10) is the same conceptual expression as Equation (2).

Next, a similar operation to Equation (9) is performed using the values obtained by Equation (10). That is, for $i_m$, parity bits $p_{\{x+(m \mod M_2) \times q\} \mod(N_2-K_2)}$ are updated. For m=1 (i.e. $i_1$), for example, parity bits $P_{\{x+(m \mod M_2) \times q\} \mod(N_2-K_2)}$ are updated as given in the following equation:

$$p_{15}=p_{15} \oplus i_0, p_{749}=p_{749} \oplus i_0, p_{278}=p_{278} \oplus i_0,$$

$$p_{213}=p_{213} \oplus i_0, p_{1301}=p_{1301} \oplus i_0, p_{125}=p_{125} \oplus i_0,$$

$$p_{511}=p_{551} \oplus i_0, p_{262}=p_{262} \oplus i_0, p_{1146}=p_{1146} \oplus i_0,$$

$$p_{684}=p_{684} \oplus i_0, p_{766}=p_{766} \oplus i_0, p_{585}=p_{585} \oplus i_0,$$

$$p_{1287}=p_{1287} \oplus i_0. \tag{11}$$

In Equation (11), $\oplus$ (denotes binary addition. It is to be noted that q=15 in the case of Equation (11). Such an operation is also performed for m=1, 2, ..., 89 in the same manner.

Step 5: In the same manner as in step 3, for the 91th information word bit $i_{90}$, information on $R_{2,0}^{(k)}$(k=1, 2, ..., 13) is fetched, $S_{2,0}^{(k)}$ are calculated, and specific parity bits $p_x$ are updated (Here, x denotes $S_{2,0}^{(k)}$). For the next 89 information word bits $i_{91}, i_{92}, \ldots, i_{179}$ following $i_{90}$, parity bits $P_{\{x+(m \mod M_2) \times q\} \mod(N_2-K_2)}$ (m=91, 92, ..., 179) are updated by applying Equation (10). For all 90 information word bit groups, steps 2, 3 and 4 are repeated respectively.

Step 6: Parity bits are determined by the following equation:

$$p_i=p_i \oplus p_{i-1}, i=1,2,\ldots,N_2-K_2-1 \tag{12}$$

In Equation (12), parity bits $p_i$ are parity bits for which LDPC encoding is completed.

Meanwhile, in step 3, since the values of $S_{1,0}^{(k)}$ are obtained from $R_{1,0}^{(k)}$, based on $S_{1,0}^{(k)}=R_{1,0}^{(k)} \mod(N_2-K_2)$, the following equation is established:

$$\{S_{1,0}^{(k)}+(m \mod M_2) \times q\} \mod(N_2-K_2)=\{R_{1,0}^{(k)}+(m \mod M_2) \times q\} \mod(N_2-K_2) \tag{13}$$

Therefore, steps 3, 4, and 5 may be combined and expressed by the following one step without a separate step of obtaining $S_{1,0}^{(k)}$.

Combining of steps 3, 4, and 5: For m=0, 1, ..., $M_2-1$, j=0, 1, ... $K_2/M_2-1$, and k=1, 2, ..., $D_j$, parity bits $p_{\{R_{j,m}^{(k)}+(m \mod M_2) \times q\} \mod(N_2-K_2)}$ are updated as given in the following equation:

$$p_{\{R_{j,m}^{(k)}+(m \mod M_2) \times q\} \mod(N_2-K_2)}= p_{\{R_{j,m}^{(k)}+(m \mod M_2) \times q\} \mod(N_2-K_2)} \oplus i_{j^m(M_2+m)} \tag{14}$$

In Equation (14), M2=90 and q=15.

The aforementioned exemplary embodiment of an LDPC encoding scheme is merely one example, and various parity check matrices may be generated based on the above Rules for generating a parity check matrix of an LDPC code.

The above LDPC encoding scheme is a method in which shortening and puncturing are not applied to a second LDPC code to be newly generated from a first parity check matrix, and algebraic code characteristics, such as a code rate or degree distributions of rows and columns in a newly generated second parity check matrix, are the same as those of the first parity check matrix. Therefore, in order to obtain an LDPC code having different algebraic characteristics from the first parity check matrix, there is provided a method in which shortening is applied to the newly generated second parity check matrix, and then puncturing is applied to a part of an LDPC codeword obtained by applying the above encoding scheme.

Hereinafter, a detailed description will be given of a method of obtaining LDPC codes having different algebraic characteristics by applying shortening and puncturing to a second parity check matrix that has been obtained from a first parity check matrix by using the above Rules 3, 4, and 5.

First, for the convenience of explanation, it is assumed that the block length, information word length, and grouping size of a first parity check matrix corresponding to the parity check matrix of the LDPC code represented in the above Rules 1 and 2 are $N_1$, $K_1$, and $M_1$ respectively. Then, a second parity check matrix having a block length of $N_2=N_1/r$, an information word length of $K_2=K_1/r$, and a grouping size of $M_2=M_1/r$ can be obtained from the first parity check matrix, based on the above Rules 3, 4, and 5. With regard to this, it is to be noted that the newly generated second parity check matrix itself has the same algebraic characteristics, such as a code rate or degree distributions of rows and columns, as those of the first parity check matrix.

Further, it is assumed that the block length and information word length of a third parity check matrix to be finally obtained are $N_3$ and $K_3$ respectively. If $N_2-N_3=N_\Delta$ and $K_2-K_3=K_\Delta$ are defined, then the third parity check matrix having a block length of $N_3$ and an information word length of $K_3$ can be obtained by shortening the second parity check matrix by $K_\Delta$ bits and puncturing the second parity check matrix by $(N_\Delta-K_\Delta)$ bits. The third parity check matrix generated in this way has a code rate of $$\frac{K_2 - N_\Delta}{N_2 - N_\Delta}$$

when $N_\Delta>0$ or $K_\Delta>0$. That is, the code rate of the third parity check matrix is different from that of the second parity check matrix $$\left(\text{e.g. } \frac{K_2}{N_2}\right),$$

and thus the third parity check matrix has different algebraic characteristics. $N_\Delta=K_\Delta=0$ is the case where shortening or puncturing is not applied.

Reference will now be made in detail to an example of generating a new third parity check matrix having a block length of $N_3=4050$ and an information word length of $K_3=1080$ through shortening and puncturing by using an LDPC code, the parity check matrix (first parity check matrix) of which has characteristics of $N_1=16200$, $K_1=7200$, $M_1=360$, and $q=25$, with reference to FIG. 6.

Figure 6:
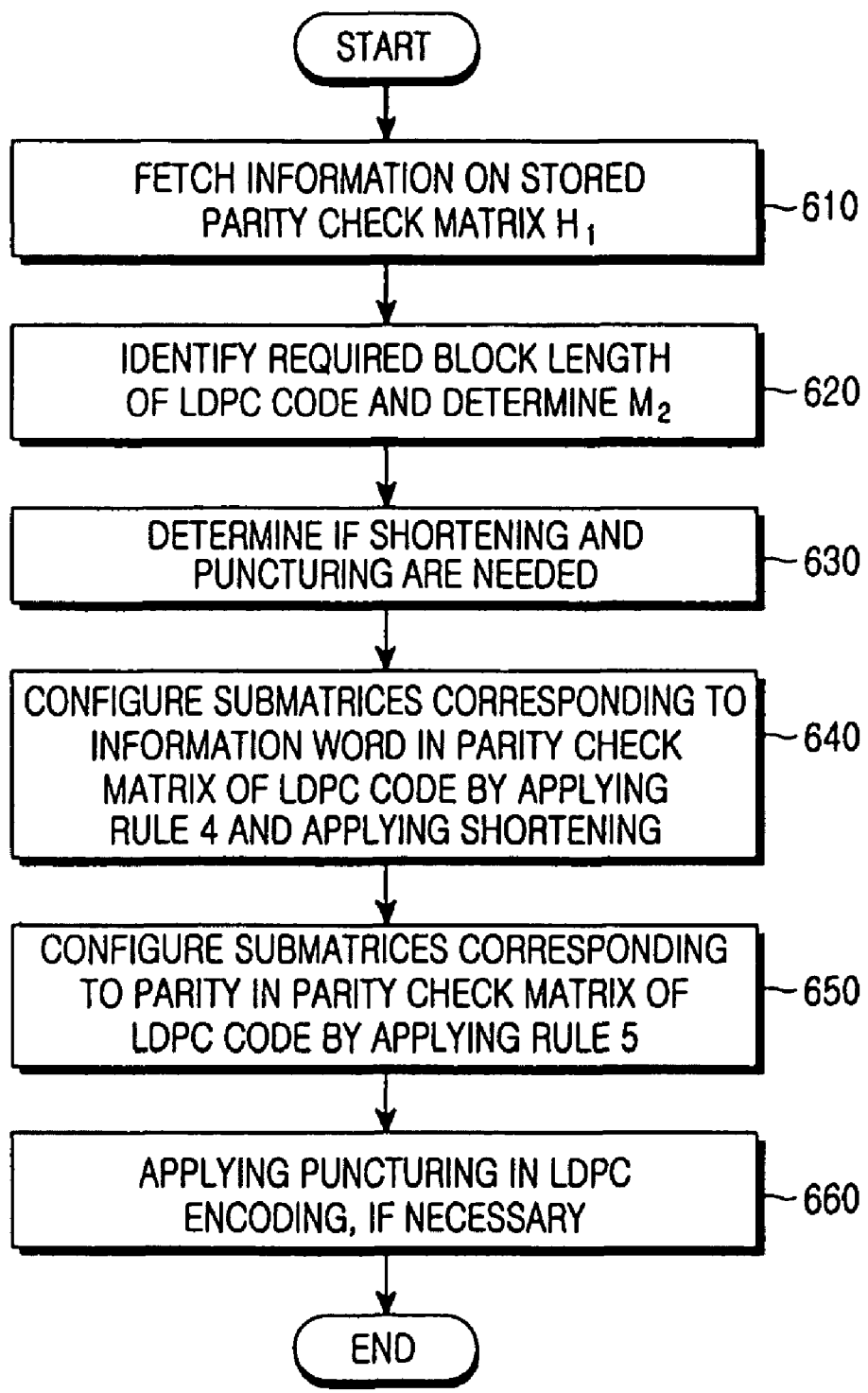
FIG. 6 is a flowchart illustrating a procedure of generating an LDPC code of a different block length from a pre-stored parity check matrix of an LDPC code by using a combination of shortening and puncturing in accordance with an exemplary embodiment of the present invention.

Referring to FIG. 6, in step 610, the LDPC encoder detects the pre-stored first parity check matrix $H_1$. In step 620, the LDPC encoder identifies a required block length of the LDPC code to then determine a grouping size $M_2$ corresponding thereto, as in the above Rule 3. $M_2$ is set to $M_2=120$ according to the above Rule 3 in step 3, and whether or not shortening and puncturing are needed is determined in step 630. In addition, in steps 640 and 650, a second parity check matrix of a second LDPC code, which is of $N_2=5400$ and $K_2=2400$, can be obtained based on the above Rules 4 and 5. Here, since $N_2-N_3=1350$ and $K_2-K_3=1320$ are established, in step 660, the third parity check matrix having a block length of $N_3=4050$ and an information word length of $K_3=1080$ can be generated by shortening the second parity check matrix by 1320 bits and puncturing the second parity check matrix by 30 bits. For reference, the first parity check matrix has a code rate of 4/9, and the third parity check matrix has a code rate of 4/15. That is, it can be noted that the third parity check matrix has a different code rate from that of the first parity check matrix.

There may be various methods of shortening the second parity check matrix, and one specific method among them will be described by way of example.

According to Rule 2, in the DVB-S2 LDPC code, row positions including an entry of 1 in all columns of a corresponding column group can be obtained by row positions including an entry of 1 in the 0th column of each ith column group ($i=1, \ldots, K_1/M_1$). Information on a total of 20 information word column groups is given in the LDPC code having characteristics of $N_1=16200$, $K_1=7200$, $M_1=360$, and $q=25$, and information on row positions including an entry of 1 in the 0th column of each ith column group ($i=1, 2, \ldots, 20$) is as follows:

$R_{1,0}^{(1)}=20, R_{1,0}^{(2)}=712, R_{1,0}^{(3)}=2386, R_{1,0}^{(4)}=6354,$ $R_{1,0}^{(5)}=4061, R_{1,0}^{(6)}=1062, R_{1,0}^{(7)}=5045, R_{1,0}^{(8)}=5158,$ $R_{2,0}^{(1)}=21, R_{2,0}^{(2)}=2543, R_{2,0}^{(3)}=5748, R_{2,0}^{(4)}=4822,$ $R_{2,0}^{(5)}=2348, R_{2,0}^{(6)}=3089, R_{2,0}^{(7)}=6328, R_{2,0}^{(8)}=5876$ $R_{3,0}^{(1)}=22, R_{3,0}^{(2)}=926, R_{3,0}^{(3)}=5701, R_{3,0}^{(4)}=269,$ $R_{3,0}^{(5)}=3693, R_{3,0}^{(6)}=2438, R_{3,0}^{(7)}=3190, R_{3,0}^{(8)}=3507,$ $R_{4,0}^{(1)}=23, R_{4,0}^{(2)}=2802, R_{4,0}^{(3)}=4520, R_{4,0}^{(4)}=3577,$ $R_{4,0}^{(5)}=5324, R_{4,0}^{(6)}=1091, R_{4,0}^{(7)}=4667, R_{4,0}^{(8)}=4449,$ $R_{5,0}^{(1)}=24, R_{5,0}^{(2)}=5140, R_{5,0}^{(3)}=2003, R_{5,0}^{(4)}=1263,$ $R_{5,0}^{(5)}=4742, R_{5,0}^{(6)}=6497, R_{5,0}^{(7)}=1185, R_{5,0}^{(8)}=6202,$ $R_{6,0}^{(1)}=0, R_{6,0}^{(2)}=4046, R_{6,0}^{(3)}=6934, R_{7,0}^{(1)}=1, R_{7,0}^{(2)}=2855, R_{7,0}^{(3)}=66,$ $R_{8,0}^{(1)}=2, R_{8,0}^{(2)}=6694, R_{8,0}^{(3)}=212, R_{9,0}^{(1)}=3, R_{9,0}^{(2)}=3439, R_{9,0}^{(3)}=1158,$ $R_{10,0}^{(1)}=4, R_{10,0}^{(2)}=3850, R_{10,0}^{(3)}=4422, R_{11,0}^{(1)}=5, R_{11,0}^{(2)}=5924, R_{11,0}^{(3)}=290,$ $R_{12,0}^{(1)}=6, R_{12,0}^{(2)}=1467, R_{12,0}^{(3)}=4049, R_{13,0}^{(1)}=7, R_{13,0}^{(2)}=7820, R_{13,0}^{(3)}=2242,$ $R_{14,0}^{(1)}=8, R_{14,0}^{(2)}=4606, R_{14,0}^{(3)}=3080, R_{15,0}^{(1)}=9, R_{15,0}^{(2)}=4633, R_{15,0}^{(3)}=7877,$ $R_{16,0}^{(1)}=10, R_{16,0}^{(2)}=3884, R_{16,0}^{(3)}=6868, R_{17,0}^{(1)}=11, R_{17,0}^{(2)}=8935, R_{17,0}^{(3)}=4996,$ $R_{18,0}^{(1)}=12, R_{18,0}^{(2)}=3028, R_{18,0}^{(3)}=764, R_{19,0}^{(1)}=13, R_{19,0}^{(2)}=5988, R_{19,0}^{(3)}=1057,$ $R_{20,0}^{(1)}=14, R_{20,0}^{(2)}=7411, R_{20,0}^{(3)}=3450.$

If the above information on information word column groups is used in its entirety, the information word length is $K_2=120\times20=2400$ when $M_2=120$, based on Rules 3, 4, and 5. However, it is assumed that information on only 9 column groups is used from among the information on 20 column groups, as given below:

$R_{2,0}^{(1)}=21, R_{2,0}^{(2)}=2543, R_{2,0}^{(3)}=5748, R_{2,0}^{(4)}=4822,$ $R_{2,0}^{(5)}=2348, R_{2,0}^{(6)}=3089, R_{2,0}^{(7)}=6328, R_{2,0}^{(8)}=5876$ $R_{3,0}^{(1)}=22, R_{3,0}^{(2)}=926, R_{3,0}^{(3)}=5701, R_{3,0}^{(4)}=269,$ $R_{3,0}^{(5)}=3693, R_{3,0}^{(6)}=2438, R_{3,0}^{(7)}=3190, R_{3,0}^{(8)}=3507,$ $R_{4,0}^{(1)}=23, R_{4,0}^{(2)}=2802, R_{4,0}^{(3)}=4520, R_{4,0}^{(4)}=3577,$ $R_{4,0}^{(5)}=5324, R_{4,0}^{(6)}=1091, R_{4,0}^{(7)}=4667, R_{4,0}^{(8)}=4449,$ $R_{5,0}^{(1)}=24, R_{5,0}^{(2)}=5140, R_{5,0}^{(3)}=2003, R_{5,0}^{(4)}=1263,$ $R_{5,0}^{(5)}=4742, R_{5,0}^{(6)}=6497, R_{5,0}^{(7)}=1185, R_{5,0}^{(8)}=6202,$ $R_{6,0}^{(1)}=0, R_{6,0}^{(2)}=4046, R_{6,0}^{(3)}=6934, R_{13,0}^{(1)}=7, R_{13,0}^{(2)}=7820, R_{13,0}^{(3)}=2242,$ $R_{14,0}^{(1)}=8, R_{14,0}^{(2)}=4606, R_{14,0}^{(3)}=3080, R_{18,0}^{(1)}=12, R_{18,0}^{(2)}=3028, R_{18,0}^{(3)}=764,$ $R_{20,0}^{(1)}=14, R_{20,0}^{(2)}=7411, R_{20,0}^{(3)}=3450.$

If the above information on only 9 column groups is used to generate a parity check matrix for M2=120, based on Rules 3, 4, and 5, the information word length is $K_2=120\times9=1080$, which can produce the same effect as when shortening for unused 11 information word column groups is applied.

The above example of shortening is merely an example of shortening for column groups, and various shortening methods, such as shortening bit by bit, may be applied in the present invention.

A typical example of puncturing methods is a method in which, when the number of puncturing bits is $N_p$, and the parity length of an LDPC code corresponding to a newly generated second parity check matrix is $N_2-K_2$, one bit is punctured every $N_2-K_2/N_p$ parity bits, but various other methods may be applied.

As describe above, exemplary embodiments of the present invention make it possible to generate LDPC codes of various block lengths by using information on a given parity check matrix in a communication system using LDPC codes, thereby enhancing the extensibility and flexibility of the system.

In addition, exemplary embodiments of the present invention increases memory efficiency because it is sufficient to store information on only one parity check matrix, even in a communication system supporting various block lengths.

While the invention has been shown and described with reference to a certain exemplary embodiment thereof, it will be understood by those skilled in the art that various changes in form and details may be made therein without departing from the spirit and scope of the invention as defined by the appended claims and equivalents thereof.

What is claimed is:

1. A method of encoding a structured variable-length Low-Density Parity Check (LDPC) code, the method comprising:
   detecting, by an encoder, information on a pre-stored first parity check matrix;
   identifying, by the encoder, a block length of a LDPC code;
   determining, by the encoder, a grouping size for an information word of a second parity check matrix according to the identified block length of the LDPC code;
   configuring, by the encoder, submatrices corresponding to the information word of the second parity check matrix from the first parity check matrix in correspondence with the grouping size;
   configuring, by the encoder, submatrices corresponding to a parity of the second parity check matrix; and
   performing, by the encoder, encoding based on one of the first parity check matrix and the second parity check matrix.

2. The method as claimed in claim 1, wherein the grouping size for the information word of the second parity check matrix is one of a divisor and a multiple of a grouping size for an information word of the first parity check matrix.

3. The method as claimed in claim 1, wherein the configuring of the submatrices corresponding to the information word of the second parity check matrix comprises determining positions including an entry of 1 in the information word of the second parity check matrix by using positions including an entry of 1 in an information word of the first parity check matrix and the grouping size for the information word of the second parity check matrix.

4. The method as claimed in claim 2, wherein, in the configuring of the submatrices corresponding to the information word of the second parity check matrix, row positions including an entry of 1 in a jth column ($j=0, 1, 2, \ldots, M_2-1$) of an ith column group of the second parity check matrix, $S_{i,k}^{(k)}$ ($k=1, 2, \ldots, D_i$), are defined by a following equation:

for $i=0,1,\ldots,K_2/M_2-1$ and $j=0,1,2,\ldots,M_2-1$, $$S_{i,0}^{(k)}=R_{i,0}^{(k)} \bmod(N_2-K_2), k=1,2,\ldots,D_i,$$

$$S_{i,j}^{(k)}=S_{i,(j-1)}^{(k)}+q \bmod(N_2-K_2).$$

5. The method as claimed in claim 1, wherein the configuring of the submatrices corresponding to the parity comprises configuring the submatrices in correspondence with the grouping size.

6. The method as claimed in claim 1, further comprising applying shortening and puncturing to the second parity check matrix.

7. The method as claimed in claim 1, further comprising generating the second parity check matrix corresponding to the block length of the LDPC code.

8. An apparatus for encoding a variable-length Low-Density Parity Check (LDPC) code, the apparatus comprising:
   an encoder for identifying a block length of a LDPC code to determine a grouping size for an information word of a second parity check matrix according to the identified block length of the LDPC code, for configuring submatrices corresponding to the information word of the second parity check matrix from a pre-stored first parity check matrix in correspondence with the grouping size; for configuring submatrices corresponding to a parity of the second parity check matrix, and for performing encoding based on one of the first parity check matrix and the second parity check matrix;
   a modulator for modulating the LDPC code into modulation symbols using a preset modulation scheme; and
   a transmitter for transmitting the modulation symbols.

9. The apparatus as claimed in claim 8, wherein the grouping size for the information word of the second parity check matrix is one of a divisor and a multiple of a grouping size for an information word of the first parity check matrix.

10. The apparatus as claimed in claim 8, wherein the encoder determines positions including an entry of 1 in the information word of the second parity check matrix by using positions including an entry of 1 in an information word of the first parity check matrix and the grouping size for the information word of the second parity check matrix.

11. The apparatus as claimed in claim 10, wherein the encoder determines row positions including an entry of 1 in a jth column ($j=0, 1, 2, \ldots, M_2-1$) of an ith column group of the second parity check matrix, $S_{i,k}^{(k)}$ ($k=1, 2, \ldots, D_i$), the row positions $S_{i,k}^{(k)}$ ($k=1, 2, \ldots, D_i$) being defined by a following equation:

for $i=0,1,\ldots,K_2/M_2-1$ and $j=0,1,2,\ldots,M_2-1$, $$S_{i,0}^{(k)}=R_{i,0}^{(k)} \bmod(N_2-K_2), k=1,2,\ldots,D_i,$$

$$S_{i,j}^{(k)}=S_{i,(j-1)}^{(k)}+q \bmod(N_2-K_2).$$

12. The apparatus as claimed in claim 8, wherein the encoder configures the submatrices corresponding to the parity in correspondence with the grouping size.

13. The apparatus as claimed in claim 8, wherein the encoder applies shortening and puncturing to the second parity check matrix.

14. The apparatus as claimed in claim 8, wherein the second parity check matrix is generated corresponding to the block length of the LDPC code.

15. A method of decoding a structured variable-length Low-Density Parity Check (LDPC) code, the method comprising:

receiving a signal;
detecting information on a pre-stored first parity check matrix;
identifying a block length of an LDPC code to be decoded;
determining a grouping size for an information word of a second parity check matrix according to the identified block length of the LDPC code;
configuring submatrices corresponding to the information word of the second parity check matrix from the first parity check matrix in correspondence with the grouping size;
configuring submatrices corresponding to a parity of the second parity check matrix; and
decoding the received signal into the LDPC code, based on one of the first parity check matrix and the second parity check matrix.

16. The method as claimed in claim 15, further comprising generating the second parity check matrix corresponding to the block length of the LDPC code.

17. An apparatus for decoding a variable-length Low-Density Parity Check (LDPC) code, the apparatus comprising:

a receiver for receiving a signal;
a demodulator for demodulating the received signal using a preset demodulation scheme to output a demodulated signal; and
a decoder for identifying a length of an LDPC code, into which the demodulated signal output from the modulator is decoded, for determining a grouping size for an information word of a second parity check matrix according to the identified block length of the LDPC code, for configuring submatrices corresponding to the information word of the second parity check matrix from a pre-stored first parity check matrix in correspondence with the grouping size and configuring submatrices corresponding to a parity of the second parity check matrix, and for decoding the received signal into the LDPC code, based on one of the first parity check matrix and the second parity check matrix.

18. The apparatus as claimed in claim 17, wherein the second parity check matrix is generated corresponding to the block length of the LDPC code.

\* \* \* \* \*